(12) United States Patent
Hsu

(10) Patent No.: US 11,385,279 B2
(45) Date of Patent: Jul. 12, 2022

(54) CHIP TEST DEVICE AND METHOD

(71) Applicant: Changxin Memory Technologies, Inc., Anhui (CN)

(72) Inventor: Chia-Chi Hsu, Hefei (CN)

(73) Assignee: Changxin Memory Technologies, Inc., Hefei (CN)

(*) Notice: Subject to any disclaimer, the term of this patent is extended or adjusted under 35 U.S.C. 154(b) by 0 days.

(21) Appl. No.: 17/124,088

(22) Filed: Dec. 16, 2020

(65) Prior Publication Data

US 2021/0102995 A1    Apr. 8, 2021

Related U.S. Application Data

(63) Continuation of application No. PCT/CN2019/103359, filed on Aug. 29, 2019.

(30) Foreign Application Priority Data

Sep. 3, 2018  (CN) .......................... 201811019070.6
Sep. 3, 2018  (CN) .......................... 201821435408.1

(51) Int. Cl.
*G01R 31/10*  (2006.01)
*G01R 31/28*  (2006.01)

(52) U.S. Cl.
CPC ..... *G01R 31/2868* (2013.01); *G01R 31/2863* (2013.01)

(58) Field of Classification Search
CPC ............ G01R 31/2863; G01R 31/2868; G01R 31/2884; G01R 31/2891; G01R 31/31922;
(Continued)

(56) References Cited

U.S. PATENT DOCUMENTS 6,476,630 B1   11/2002  Whitten et al.
7,595,629 B2 *  9/2009  Miller .................. G01R 35/005
                                                           324/750.02
(Continued)

FOREIGN PATENT DOCUMENTS

CN       1436307 A       8/2003
CN       1797001 A       7/2006
(Continued)

OTHER PUBLICATIONS

PCT International Search Report and the Written Opinion dated Dec. 4, 2019, issued in related International Application No. PCT/CN2019/103359 (10 pages).

*Primary Examiner* — Thang X Le
(74) *Attorney, Agent, or Firm* — Sheppard Mullin Richter & Hampton LLP

(57) ABSTRACT

A chip test device and a chip test method are provided. The chip test device may include a chip socket and an interface card comprising a signal synthesizer, a plurality of first interfaces and a second interface. The signal synthesizer may be configured to synthesize a plurality of low-frequency first signals output from a plurality of testers into a high-frequency second signal and transmit the second signal to the chip socket. The plurality of first interfaces may be arranged in a plurality of inputs of the signal synthesizer for connecting the testers, and the second interface may be arranged in an output of the signal synthesizer for connecting the chip socket. By synthesizing the low-frequency first signals into the high-frequency second signal, a high-frequency test may be conducted using a plurality of low-frequency testers.

16 Claims, 3 Drawing Sheets

(58) Field of Classification Search
CPC ........ G01R 31/31719; G01R 31/31723; G01R 31/31727; G01R 31/318505; G01R 31/318511; G01R 31/31937
See application file for complete search history.

(56) References Cited

U.S. PATENT DOCUMENTS

| | | | |
|---|---|---|---|
| 7,868,463 B2* | 1/2011 | Lin | G01R 31/2884 |
| | | | 257/777 |
| 2004/0059971 A1* | 3/2004 | Cowan | G01R 31/2834 |
| | | | 714/724 |
| 2006/0150047 A1 | 7/2006 | Nikutta et al. | |
| 2007/0101219 A1* | 5/2007 | Jang | G01R 31/3191 |
| | | | 714/724 |
| 2010/0182035 A1* | 7/2010 | Byun | G11C 29/56012 |
| | | | 324/762.01 |
| 2017/0212164 A1* | 7/2017 | Caradonna | G01R 31/2889 |
| 2018/0332415 A1* | 11/2018 | Quan | H04R 3/04 |

FOREIGN PATENT DOCUMENTS

| | | |
|---|---|---|
| CN | 201402901 Y | 2/2010 |
| CN | 202494737 U | 10/2012 |
| CN | 102798814 A | 11/2012 |
| CN | 108957300 A | 12/2018 |
| CN | 208953661 U | 6/2019 |

* cited by examiner

CHIP TEST DEVICE AND METHOD

CROSS-REFERENCE TO RELATED APPLICATION

This application is a continuation application of International Patent Application No. PCT/CN2019/103359, filed on Aug. 29, 2019, which is based on and claims priority of the Chinese Patent Application Nos. 201811019070.6 and 201821435408.1, both filed on Sep. 3, 2018 and entitled "CHIP TEST DEVICE AND METHOD." The above-referenced applications are incorporated herein by reference in their entirety.

TECHNICAL FIELD

This disclosure relates generally to the technical field of chip inspection, and more specifically, to a chip test device and a chip test method.

BACKGROUND

With the development and advancement in semiconductor technology, integrated circuits (ICs) nowadays may include a large number of chips, which may need to be tested to ensure their qualities. Operating frequencies of memory ICs have been continuously increasing. As a result, memory chips need to work under increasingly high frequencies, and these chips need to be tested under high frequencies to ensure that they meet the desired specs. Many existing chip testers in production lines, however, cannot meet such high-frequency testing requirements. Solely relying on existing high-frequency testers (and thereby completely disposing conventional low-frequency testers) to do the chip tests could be prohibitively expensive. Therefore, a test device and a test method that are capable of testing high-frequency chips using existing low-frequency testers are highly desirable.

It is to be noted that the above information disclosed in this Background section is only for the understanding of the background of this inventive concept and therefore may contain information that does not form the prior art that is already known to a person of ordinary skill in the art.

SUMMARY

In view of the limitations of existing technologies described above, this inventive concept provides a chip test device and a chip test method that can address at least some of the aforementioned limitations.

One aspect of this inventive concept is directed to a chip test device. The device may comprise a chip socket and an interface card. The interface card may comprise: a signal synthesizer, a plurality of first interfaces and a second interface. The signal synthesizer may be configured to synthesize a plurality of first signals into a second signal and transmit the second signal to the chip socket. The plurality of first signals may have a predetermined phase difference therebetween, and a frequency of the second signal may be higher than a frequency of the plurality of first signals. The plurality of first interfaces may be arranged in a plurality of inputs of the signal synthesizer, and the second interface may be arranged in an output of the signal synthesizer for connecting the chip socket.

In some embodiments, the aforementioned device may further comprise a plurality of testers that are connected to the plurality of first interfaces respectively and configured to output the plurality of first signals.

In some embodiments, the aforementioned device may further comprise a controller. The controller may be connected to the plurality of testers and configured to control the plurality of first signals output from the plurality of testers, so that the plurality of first signals may have the predetermined phase difference therebetween.

In some embodiments, the signal synthesizer may comprise a plurality of buffers. The plurality of buffers may each have an input corresponding to one of the plurality of first interfaces, and may have outputs that are connected together so as to synthesize the plurality of first signals into the second signal.

In some embodiments, the signal synthesizer may comprise an OR gate. The OR gate may be configured to receive the plurality of first signals, synthesize the plurality of first signals into the second signal, and transmit the second signal to the chip socket.

In some embodiments, the signal synthesizer may comprise an adder. The adder may be configured to receive the plurality of first signals, synthesize the plurality of first signals into the second signal, and transmit the second signal to the chip socket.

In some embodiments, the chip socket may be coupled to the second interface and configured to accommodate a chip.

Another aspect of this inventive concept is directed to a chip test method. The method may comprise receiving, from a plurality of testers, a plurality of first signals, synthesizing, by a signal synthesizer, the plurality of first signals into a second signal, and transmitting the second signal to a chip socket to enable a testing of a chip thereon. The plurality of first signals may have a predetermined phase difference therebetween, and a frequency of the second signal may be higher than a frequency of the plurality of the first signals.

In some embodiments, the aforementioned method may further include, before receiving the plurality of first signals, outputting, by the plurality of testers, the plurality of first signals, respectively.

In some embodiments, outputting the plurality of first signals may comprise: respectively outputting the plurality of first signals by the plurality of testers under a control of a controller so that the plurality of first signals have a predetermined phase difference therebetween.

In some embodiments, synthesizing the plurality of first signals into a second signal may comprise: synthesizing, by a plurality of buffers in the signal synthesizer, the plurality of first signal into a second signal. The plurality of buffers may have outputs connected together so as to synthesize the plurality of first signals into the second signal.

In some embodiments, synthesizing the plurality of first signals into a second signal may comprise: receiving, by an OR gate in the signal synthesizer, the plurality of first signals, and synthesizing, by the OR gate, the plurality of first signals into the second signal. Transmitting the second signal to a chip socket may comprise transmitting, by the OR gate, the second signal to the chip socket.

In some embodiments, synthesizing the plurality of first signals into a second signal may comprise synthesizing, by an adder in the signal synthesizer, the plurality of first signals into the second signal. Transmitting the second signal into a chip socket may comprise transmitting, by the adder, the second signal to the chip socket.

In the chip test device of this inventive concept, the plurality of first interfaces on the interface card may be connected with a plurality of testers, respectively, and the plurality of first signals from the testers may be synthesized into a second signal by a signal synthesizer. Thus, low-frequency first signals may be synthesized into the high-frequency second signal that can be used to test chips at a high frequency. By using the signal synthesizer configured to connect to the plurality of low-frequency testers, chips can be tested at a high frequency. Thus, comparing to using existing high-frequency testers (and thereby completely disposing conventional low-frequency testers) for testing the chips, the testing cost may be substantially reduced.

It is to be understood that the foregoing general description and the following detailed description are exemplary and explanatory only and are not restrictive of this inventive concept.

BRIEF DESCRIPTION OF THE DRAWINGS

The accompanying drawings, which are incorporated in and constitute a part of the specification, illustrate embodiments consistent with the present disclosure and, together with the specification, serve to explain the disclosed principles. Apparently, these drawings present only some embodiments of the disclosure, and those of ordinary skill in the art may obtain drawings of other embodiments from them without exerting any creative effort.

NUMERALS IN THESE DRAWINGS

Figure 1:
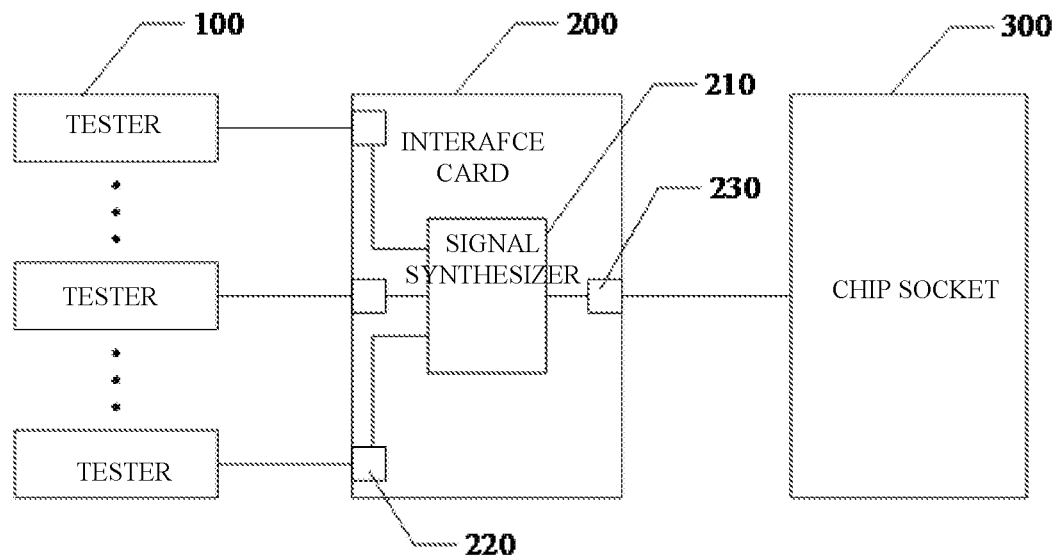
FIG. 1 is a schematic diagram of a chip test device in accordance with one embodiment of this inventive concept.

100: a tester; 200: an interface card; 210: a signal synthesizer; 211: a buffer; 220: a first interface; 230: a second interface; and 300: a chip socket.

DETAILED DESCRIPTION OF THE EMBODIMENTS

Exemplary embodiments will be described more comprehensive with reference to the accompanying drawings. However, the embodiments can be implemented in many forms and should not be construed as being limited to those set forth herein. Rather, these embodiments are presented to provide a full and thorough understanding of this inventive concept and to fully convey the concepts of the embodiments to others skilled in the art. In addition, the described features, structures, and characteristics may be combined in any suitable manner in one or more embodiments. In view of this inventive concept herein, those skilled in the art will recognize that the various embodiments can be practiced without one or more of the specific details or with other methods, components, materials. In some instances, well-known structures, materials, or operations are not shown or not described in detail to avoid obscuring aspects of the embodiments. In the drawings, like reference numerals indicate the same or analogous elements, and duplicate detailed description thereof will thus be omitted.

Although relative terms like "upper" and "lower" may be used herein to describe a spatial relationship of one component to another in a device shown in the drawings, they are used for the purpose of easy description based on, for example, the orientation depicted in the drawings. It is to be understood that if the illustrated device is turned upside down, then the component described as being "upper" will now be a "lower" component. When a certain structure is described as being "on" another structure, it is possible that the specific structure is either integrally formed on the other structure or disposed thereon "directly" or "indirectly" via an intermediate structure.

As used herein, the terms "a", "an" "the", "said" and "at least one" are intended to mean that there are one or more elements/components/etc. As used herein, the terms "comprising" and "having" are intended to be used in an open-ended sense to mean that there are possibly other element(s)/component(s)/etc. apart from the listed element(s)/component(s)/etc. The terms "first", "second", "third", etc. as used herein are meant as labels rather than place a quantitative limitation upon the amount of the mentioned items.

In the field of chip testing, as the operating frequency of chips continuously increases, chips tests are required to be conducted at increasingly higher frequencies, which may exceed the capabilities of existing low-frequency testers.

FIG. 1 is a schematic diagram of a chip test device in accordance with one embodiment of this inventive concept. Referring to FIG. 1, the chip test device may include a chip socket 300 and an interface card 200. The interface card 200 may comprise a signal synthesizer 210, a plurality of first interfaces 220, and a second interface 230.

The signal synthesizer 210 may be configured to synthesize a plurality of first signals output from a plurality of testers 100 into a second signal and then transmit the second signal to the chip socket 300. The plurality of first interfaces 220 may be arranged in a plurality of inputs of the signal synthesizer 210 for connecting the plurality of testers 100. The second interface 230 may be arranged in an output of the signal synthesizer 210 for connecting the chip socket 300. A frequency of the second signal may be higher than a frequency of the plurality of first signals.

In some embodiments, the first interfaces 220 in the interface card 200 may be connected to a plurality of testers 100. The plurality of first signals output from the plurality of testers 100 may be synthesized into a second signal through the signal synthesizer 210. That is, a plurality of low-frequency first signals may be synthesized into one high-frequency second signal so as to meet the frequency requirements of chip testing. By using the signal synthesizer 210 configured to connect the plurality of low-frequency testers 100, chips can be tested at a high frequency, thereby saving the testing cost.

To ensure that peaks of the first signals from the plurality of testers 100 are staggered from one another when being synthesized into a desired high-frequency signal, the plurality of first signals may have a predetermined phase difference therebetween during outputting thereof. That is, a phase difference between two first signals from two testers 100 may be a constant or an integer multiplication of the constant. The plurality of first signals may be pulse signals having the same peak amplitude and the same period. In that case, to ensure that the plurality of first signals have the predetermined phase difference, the generating times of the first signals may be controlled so that different first signals are generated at a constant time interval.

Figure 2:
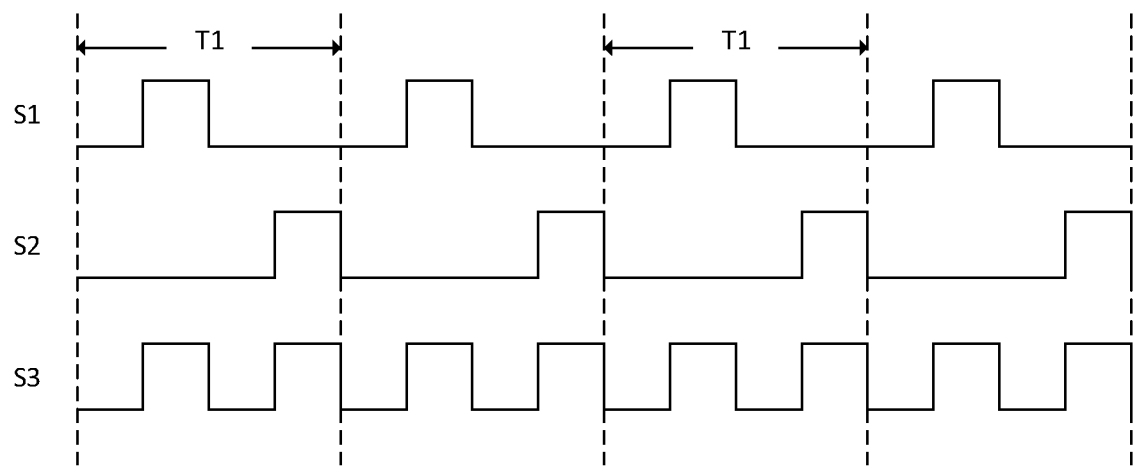
FIG. 2 is a diagram of waveforms of signals in accordance with one embodiment of this inventive concept.

FIG. 2 is a diagram of waveforms of signals in accordance with one embodiment of this inventive concept. Referring to FIG. 2, in one example, assuming there are two first signals S1 and S2, with waveforms as shown in FIG. 2 and a phase difference therebetween is equal to half of the cycle T1. The first signals S1 and S2 may be input to and synthesized in the signal synthesizer 210, thereby obtaining a synthesized second signal S3. As shown in FIG. 2, a frequency of the second signal S3 may be twice a frequency of the first signals S1 and S2.

In some embodiments, the chip test device may further include a plurality of testers 100 connected to the plurality of first interfaces 220 respectively and configured to output the plurality of first signals.

The testers 100 may be conventional low-frequency testers. In production lines, conventional low-frequency testers may otherwise be discarded and scrapped when they are not able to output signals with sufficiently high frequencies that can meet the ever-growing frequency demands of the chips, which may result in a waste of resources. In contrast, the interface card 200 according to this embodiment of this inventive concept can be configured to connect the plurality of low-frequency testers 100 and synthesize the plurality of low-frequency first signals into a high-frequency second signal.

In some embodiments, the testers 100 may be wired to the plurality of first interfaces 220 in the interface card 200 so as to provide the first signals to the signal synthesizer 210 via these first interfaces 220. Apparently, in actual applications, the testers 100 may also be wirelessly connected to the first interfaces 220, and this inventive concept is not limited in this regard. It is to be noted that the first interfaces 220 may be implemented either in the form of physical interfaces or in any other forms that are suitable for connecting the testers 100 to the signal synthesizer 210.

In some embodiments, the chip test device may further include a controller, which may be coupled to the plurality of testers 100 and configured to control the plurality of first signals output from the plurality of testers 100, so that the plurality of first signals may have the predetermined phase difference therebetween.

The controller may include a plurality of delayers for controlling the first signals output from the testers 100. Referring to FIG. 2, each of the first signals S1 and S2 may be output from one tester 100, and the controller may be connected with the two testers 100. The delayer in the controller may be configured to delay the first signal S2 output from the tester 100 by half of the cycle, so that the first signals S1 and S2 have a half cycle phase difference.

Figure 3:
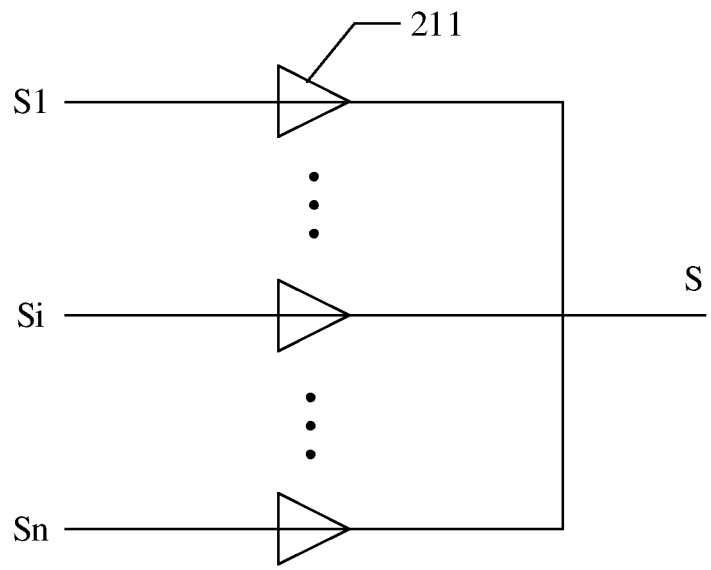
FIG. 3 is a schematic diagram of a signal synthesizer in accordance with one embodiment of this inventive concept.

FIG. 3 is a schematic diagram of a signal synthesizer in accordance with one embodiment of this inventive concept. Referring to FIG. 3, in one embodiment, the signal synthesizer 210 may include a plurality of buffers 211, each having an input corresponding to one of the plurality of first interfaces 220. The buffers 211 may have outputs that are connected together so as to synthesize the first signals into the second signal. The tester 100 may be connected with the first interface 220 and may output the first signal. Each of the plurality of first testers 100 may output one first signal and each of the first signals may be input into a buffer 211. The outputs of the plurality of buffers 211 may be connected together so as the input voltage signals may be aggregated. The voltage signals output from the plurality of buffers 211 may be synthesized into the second signal. The output of the buffers 211 may be coupled to the second interface 230, through which the second signal may be synthesized and then transmitted to the chip socket 300. Since the first signals have the predetermined phase difference (i.e., their high-levels appear alternately in time domain), the synthesized second signal may have a higher frequency than the frequency of the first signals. This allows a high-frequency signal be synthesized in a relatively simple circuit structure.

In one example, assuming each of the first signals S1 and S2 has a high level of Vih and a low level of Vil, resistors in the buffers 211 may be adjusted to allow the second signal S to have a high level of Vih+Vil/2 and a low level of Vil. Thus the buffers 211 may synthesize the first signals output from the plurality of testers 100, leading to a substantial reduction in the cost of testing chips at a high frequency. Additionally, the lowered high level may protect a chip from being damaged during a test at a high frequency.

In another embodiment, the signal synthesizer 210 may include an OR gate configured to receive the first signals output from the testers 100 through the first interfaces 220, synthesize the first signals into the second signal and transmit the second signal to the chip socket 300 via the second interface 230.

The OR gate may have inputs coupled to the first interfaces 220 to which the testers 100 are coupled. The plurality of first signals may be output from the testers 100 at a predetermined phase difference so that high-level of different first signals will not appear simultaneously. The OR gate may synthesize the plurality of first signals into one second signal so that the second signal will be at a low level only when all of the first signals are at the low level and at a high level otherwise. Because of the phase difference between the first signals, the second signal synthesized through the OR gate may have a higher frequency than the first signals. An output of the OR gate may be connected to the second interface 230 to which the chip socket 300 is connected, so that the second signal can be provided to the chip socket 300 via the second interface 230.

In another embodiment, the signal synthesizer 210 may include an adder configured to receive the first signals output from the testers 100 through the first interfaces 220, synthesize the first signals into the second signal and transmit the second signal to the chip socket 300 via the second interface 230.

The adder may have inputs coupled to the first interfaces 220 to which the testers 100 are coupled. The plurality of first signals output from the testers 100 may be synthesized by the adder into one second signal. An output of the adder may be coupled to the second interface 230 to which the chip socket 300 is connected, so that the second signal can be transmitted to the chip socket 300 via the second interface 230. The first signals may be output at a predetermined phase difference so that at most one high level is present among the plurality of first signals at any given time, that is, at most one of the first signals may be at a high level at any given time. In some embodiments, the adder may include one or more resistors, which may be adjusted so that an output of the adder is suitable for testing of chips.

In some embodiments, the chip test device may further include a chip socket 300 which may be coupled to the second interface 230 and may have slots in which chips for test can be inserted. During a test, the chips for test may be inserted into the slots for testing, and the chip socket 300 may be installed on a test bench.

Figure 4:
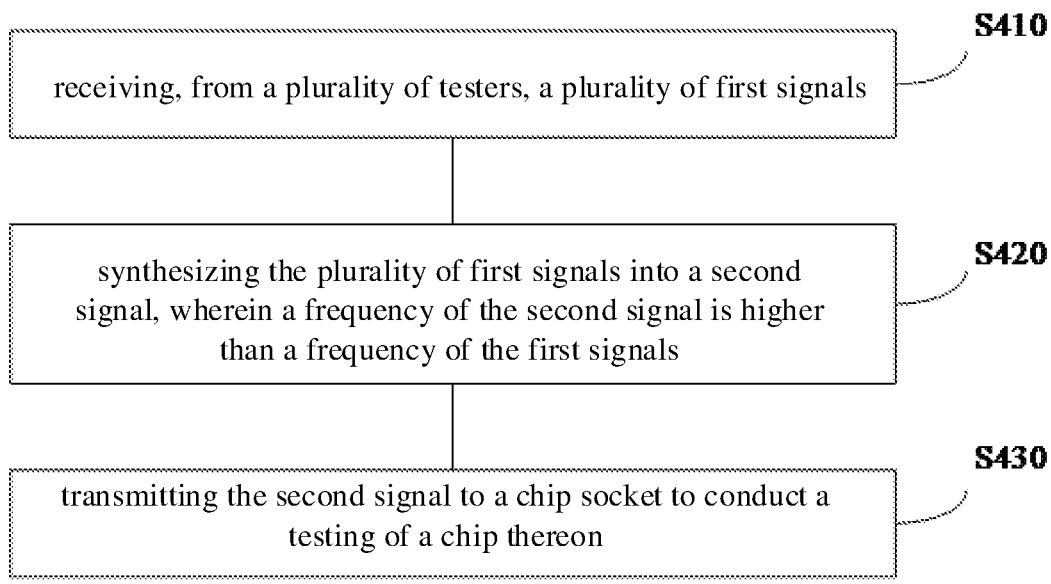
FIG. 4 shows a flowchart illustrating a chip test method in accordance with one embodiment of this inventive concept.

This inventive concept further provides a chip test method. As shown in FIG. 4, the method may include the steps of S410 through S430.

In step S410, a plurality of first signals may be received from a plurality of testers.

In step S420, the plurality of first signals may be synthesized into a second signal. The second signal may have a frequency higher than a frequency of the first signals.

In step S430, the second signal may be transmitted to a chip socket to conduct a testing of chips thereon.

In some embodiments, in the chip test method, the signal synthesizer may synthesize low-frequency first signals output from the testers into one high-frequency second signal so as to meet the frequency requirement for testing a high-frequency chip. In this method, conventional low-frequency testers may be reused to generate high frequency signals that are required for testing high-frequency chips. Thus, comparing to using existing high-frequency testers (and thereby completely disposing conventional low-frequency testers) for testing the chips, the testing cost may be substantially reduced.

Figure 5:
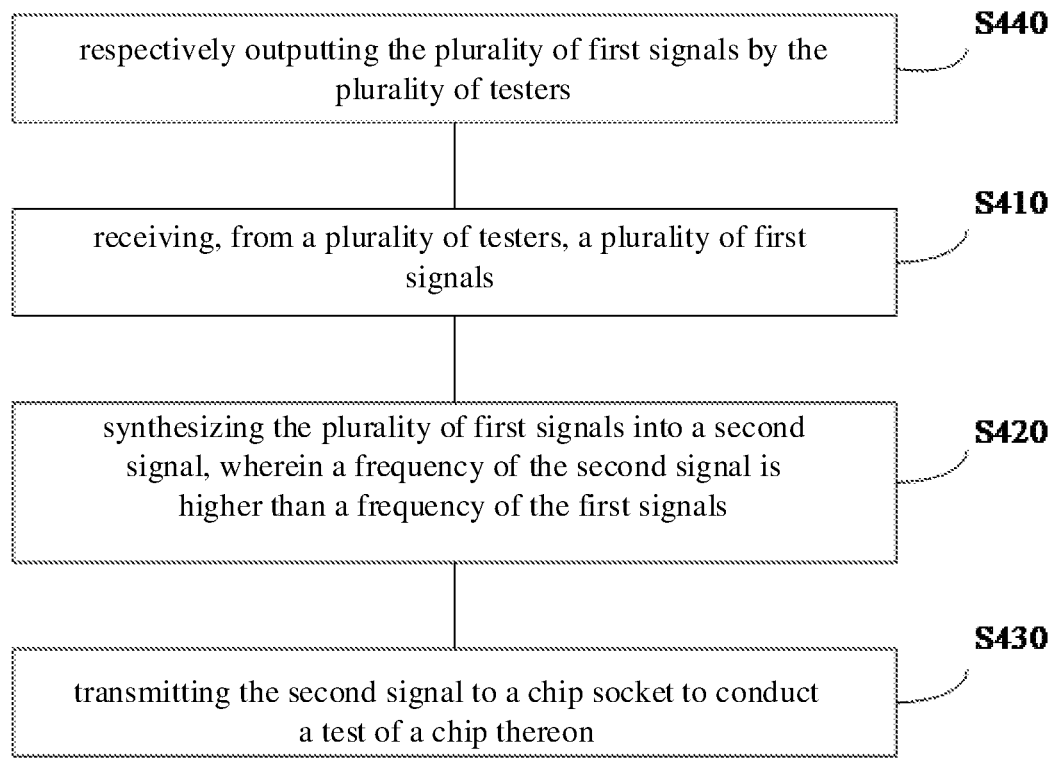
FIG. 5 shows a flowchart illustrating another chip test method in accordance with one embodiment of this inventive concept.

FIG. 5 shows a flowchart illustrating another chip test method in accordance with one embodiment of this inventive concept. Referring to FIG. 5, in addition to the method illustrated in FIG. 4, the chip test method of this embodiment may further include a step S440, which includes: before step S410, respectively outputting the plurality of first signals by the plurality of testers.

The chip test method according to this embodiment will be described in greater details below.

In step S440, the plurality of first signals may be respectively output by the plurality of testers.

In some embodiments, the testers 100 may be implemented using conventional low-frequency ones. In production lines, these conventional low-frequency testers may otherwise be discarded and scrapped when they are not able to output signals with sufficiently high frequencies to meet the ever-growing demands of higher frequencies of the chips, which may result in a waste of resources. The first signals output from the testers 100 may be pulse voltage signals having the same period and peak amplitude. The plurality of pulse voltage signals may have a predetermined phase difference so that at most one high level is present among the plurality of first signals at any given time. That is, at most one of the first signals may be at a high level at any given time. The time at which the first signals are output from the testers 100 may be controlled by the delayers in a controller so that the plurality of first signals can have the predetermined phase difference.

In step S410, a plurality of first signals may be received from a plurality of testers. A signal synthesizer may be connected to the plurality of testers 100 through a plurality of first interfaces. The signal synthesizer may receive the plurality of first signals through the plurality of first interfaces.

In step S420, the plurality of first signals may be synthesized into a second signal. A frequency of the second signal may be higher than a frequency of the first signals.

The plurality of first signals may be synthesized by a plurality of buffers, an OR gate or an adder. Since the plurality of first signals may have the predetermined phase difference, after being synthesized by the signal synthesizer, the frequency of the synthesized signal (i.e., the second signal) may be higher than the frequency of the first signals.

In step S430, the second signal may be transmitted to the chip socket to conduct a test of a chip thereon.

The signal synthesizer may have an output coupled to a second interface which is, in turn, coupled to the chip socket. As a result, the signal synthesizer may be able to transmit the second signal to the chip socket via the second interface. The chips for test may be installed in the chip socket, and the second signal may have a sufficiently high frequency that can meet the requirement of the testing frequency for the chips.

Only some specific embodiments of this inventive concept are disclosed herein, other embodiments of this inventive concept will be apparent to those skilled in the art by considering the specification and by practicing the invention disclosed herein. Accordingly, the protection scope of this disclosure is intended to cover all and any variations, uses, or adaptations of this inventive concept which follow, in general, the principles thereof and include such departures from this inventive concept that come within common knowledge or customary practice within the art to which this inventive concept pertains. It is also intended that the specification and examples be considered as exemplary only, with true scope and spirit of this inventive concept being indicated by the appended claims.

What is claimed is:

1. A chip test device, comprising:
   a plurality of testers configured to output a plurality of first signals;
   a chip socket; and
   an interface card comprising:
      a signal synthesizer configured to synthesize the plurality of first signals into a second signal and transmit the second signal to the chip socket, wherein the plurality of first signals have a predetermined phase difference therebetween, and a frequency of the second signal is higher than a frequency of the plurality of first signals;
      a plurality of first interfaces arranged in a plurality of inputs of the signal synthesizer, wherein the signal synthesizer comprises:
         a plurality of buffers each having an input corresponding to one of the plurality of first interfaces, the plurality of buffers having outputs that are connected together so as to synthesize the plurality of first signals into the second signal; and
      a second interface arranged in an output of the signal synthesizer for connecting the chip socket.

2. The device of claim 1, further comprising:
   the plurality of testers connected to the plurality of first interfaces respectively and configured to output the plurality of first signals.

3. The device of claim 2, further comprising:
   a controller connected to the plurality of testers and configured to control the plurality of first signals output from the plurality of testers, so that the plurality of first signals have the predetermined phase difference therebetween.

4. The device of claim 1, wherein the signal synthesizer comprises:
   an OR gate configured to receive the plurality of first signals, synthesize the plurality of first signals into the second signal, and transmit the second signal to the chip socket.

5. The device of claim 1, wherein the signal synthesizer comprises:
   an adder configured to receive the plurality of first signals, synthesize the plurality of first signals into the second signal, and transmit the second signal to the chip socket.

6. The device of claim 1, wherein the chip socket is coupled to the second interface and configured to accommodate a chip.

7. A chip test method, comprising:
   receiving, from a plurality of testers, a plurality of first signals;
   synthesizing, by a signal synthesizer, the plurality of first signals into a second signal by:

synthesizing, by a plurality of buffers in the signal synthesizer, the plurality of first signal into a second signal, the plurality of buffers having outputs connected together so as to synthesize the plurality of first signals into the second signal, wherein the plurality of first signals have a predetermined phase difference therebetween, and a frequency of the second signal is higher than a frequency of the plurality of first signals; and transmitting the second signal to a chip socket to enable a testing of a chip thereon.

8. The method of claim 7, further comprising, before receiving the plurality of first signals:

outputting, by the plurality of testers, the plurality of first signals, respectively.

9. The method of claim 8, wherein outputting the plurality of first signals comprises:

respectively outputting the plurality of first signals by the plurality of testers under a control of a controller so that the plurality of first signals have the predetermined phase difference therebetween.

10. The method of claim 7, wherein synthesizing the plurality of first signals into a second signal comprises:

receiving, by an OR gate in the signal synthesizer, the plurality of first signals; and synthesizing, by the OR gate, the plurality of first signals into the second signal, and wherein transmitting the second signal to a chip socket comprises:

transmitting, by the OR gate, the second signal to the chip socket.

11. The method of claim 7, wherein synthesizing the plurality of first signals into a second signal comprises:

synthesizing, by an adder in the signal synthesizer, the plurality of first signals into the second signal, and wherein transmitting the second signal to a chip socket comprises:

transmitting, by the adder, the second signal to the chip socket.

12. The method of claim 7, wherein the chip socket is coupled to a second interface of the signal synthesizer to accommodate a chip, wherein the second interface is arranged in an output of the signal synthesizer for connecting the chip socket.

13. A chip test device, comprising:

a plurality of testers configured to output a plurality of first signals;

a controller coupled to the plurality of testers;

a chip socket; and an interface card comprising:

a signal synthesizer configured to synthesize the plurality of first signals into a second signal and transmit the second signal to the chip socket, wherein the plurality of first signals have a predetermined phase difference therebetween, and a frequency of the second signal is higher than a frequency of the plurality of first signals;

a plurality of first interfaces arranged in a plurality of inputs of the signal synthesizer; and a second interface arranged in an output of the signal synthesizer for connecting the chip socket, wherein the controller includes a plurality of delayers each coupled to a corresponding tester of the plurality of testers, and configured to delay the first signal from the corresponding tester to generate the predetermined phase difference between the plurality of first signals.

14. The device of claim 13, wherein the signal synthesizer comprises:

an OR gate configured to receive the plurality of first signals, synthesize the plurality of first signals into the second signal, and transmit the second signal to the chip socket.

15. The device of claim 13, wherein the signal synthesizer comprises:

an adder configured to receive the plurality of first signals, synthesize the plurality of first signals into the second signal, and transmit the second signal to the chip socket.

16. The device of claim 13, wherein the chip socket is coupled to the second interface and configured to accommodate a chip.

* * * * *